United States Patent [19]

Hayashi et al.

[11] Patent Number: 5,162,437
[45] Date of Patent: Nov. 10, 1992

[54] EPOXY RESIN COMPOSITION WITH HYDROGENATED DIENE GLYCIDYL ETHER

[75] Inventors: Hiroshi Hayashi; Yuichi Fujii; Motoyuki Suzuki, all of Kyoto, Japan

[73] Assignee: Sanyo Chemical Industries, Ltd., Kyoto, Japan

[21] Appl. No.: 491,868

[22] Filed: Mar. 12, 1990

[30] Foreign Application Priority Data

Mar. 15, 1989 [JP] Japan ................................ 1-64362

[51] Int. Cl.⁵ ........................ C08L 63/02; C08L 63/04
[52] U.S. Cl. .................................... 525/109; 525/489; 525/524; 523/427
[58] Field of Search ................. 525/109, 489, 524; 523/427

[56] References Cited

FOREIGN PATENT DOCUMENTS 57-180626 11/1982 Japan .................................. 525/109
62-20521 1/1987 Japan .................................. 525/109
63-51447 10/1988 Japan .

OTHER PUBLICATIONS

Abstract of Japanese Patent No. 62-241971 published Oct. 22, 1987.
Chemical Abstracts, vol. 98, 1983, listing abstract of Japanese Patent Publication No. 57-180,626 dated Nov. 1982.

Primary Examiner—Robert E. Sellers
Attorney, Agent, or Firm—Birch, Stewart, Kolasch & Birch

[57] ABSTRACT

A resin composition, comprisng a glycidyl ether of a hydrogenated conjugated diene polymer, an epoxy resin, and a reaction product of a phenolic compound with formaldehyde, having improved flexibility and thermal stability and useful for sealing a semiconductor device, whereby thermal stress can be effectively reduced.

16 Claims, 1 Drawing Sheet

EPOXY RESIN COMPOSITION WITH HYDROGENATED DIENE GLYCIDYL ETHER

BACKGROUND OF THE INVENTION

1. Field of the Invention

The present invention relates to a resin composition for sealing a semiconductor device and a semiconductor device sealed with the resin composition.

2. Description of the Prior Art

When a semiconductor device is sealed with plastics under the recent trend of high integration and large-sizing of the semiconductor devices, there is a problem that the semiconductor device is reduced in its reliability, such as breakage of bonding lines and cracks in the device, due to thermal stress caused by the difference of thermal expansion coefficients between the device or a lead frame and the sealing resin compositions. As a base material for reducing the thermal stress, a compounding method utilizing 1,4-polybutadiene rubber having at least one of carboxyl group, hydroxyl group and epoxy group is already known. (Japanese Patent Publication No. Sho 63-51447)

The resin composition by the method using 1,4-polybutadiene, however, is poor in heat resisting property, such as it is oxidized at the high temperature.

SUMMARY OF THE INVENTION

It is, accordingly, an object of the present invention to provide a resin composition for sealing a semiconductor device with a superior heat resisting property and a reduction in thermal stress.

It is a more specific object of the present invention to provide a compound suitable for sealing a semiconductor device, which comprises (I) a glycidyl ether of a hydrogenated conjugated diene polymer.

(II) an epoxy resin other than that in (I), and (III) a reaction product of a phenolic compound with formaldehyde.

It is another object of the present invention to provide a composition suitable for sealing a semiconductor device, which comprises a compound formed by reacting beforehand a glycidyl ether (I) of a hydrogenated conjugated diene polymer with the reaction product (III) of a phenolic compound with formaldehyde; and an epoxy resin (II).

It is still another object of the present invention to provide a semiconductor device which is sealed with the said resin composition.

Other and further objects, features and advantages of the invention will appear more fully from the following description.

DETAILED DESCRIPTION OF THE PREFERRED EMBODIMENTS

Figure 1:
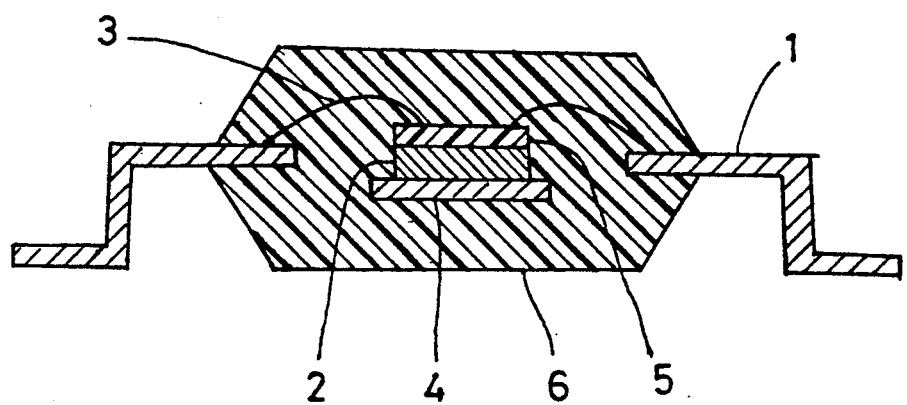
FIG. 1 is a cross sectional view of an example of the semiconductor device according to the invention herein.

The present invention relates to a resin composition for sealing a semiconductor device, the essential components of which are a glycidyl ether of a hydrogenated conjugated diene polymer (I), an epoxy resin (II) and a reaction product of a phenolic compound with formaldehyde (III); and a semiconductor device sealed with this resin composition.

The examples of the epoxy resins (II) include bisphenol type epoxy resins (for example, diglycidyl ether of bisphenol-A), phenol novolak epoxy resins (for example, polyglycidyl ether of phenol novolak, polyglycidyl ether of phenol novolak modified with alkylbenzene), cresol novolak epoxy resins (for example, polyglycidyl ether of ortho-cresol novolak), phenol epoxy resins (for example, diglycidyl ether of resorcinol, triglycidyl ether of para-aminophenol, diglycidyl ether of phloroglucin and diglycidyl ether of methyl phloroglucin), aromatic epoxy resins [1,3,5-tri (1,2-epoxyethyl) benzene, 4,4'-di (1,2-epoxyethyl) diphenyl ether, 4,4'-(1,2-epoxyethyl) biphenyl], cycloaliphatic epoxy resins [3,4-epoxycyclohexylmethyl-(3,4-epoxy) cyclohexane carboxylate, 2,2-bis (3,4-epoxy-cyclohexyl) propane, 2-(3,4-epoxy) cyclohexane-5,5-spiro (3,4-epoxy) cyclohexane-m-dioxane, bis-(3,4-epoxy-6-methylcyclohexyl) adipate, N,N'-m-phenylenebis (4,5-epoxy-1,2-cyclohexane) dicarboxyimid], the other epoxy resins [butadiene diepoxide, di- and triglycidyl ether of trimethylol propane, di- and triglycidyl ether of glycerol, bis-(2,3-epoxy-cyclopentyl) ether etc.]. The preferable among these are the epoxy resins of phenol novolak resins and cresol novolak resins.

The molecular weight of (II) is usually from about 100 to about 1,500, preferably from about 200 to about 1,000. The epoxy equivalent weight of (II) is usually from 50 to 1,000 g/eq, preferably 100 to 300 g/eq.

The phenolic compounds which are used for the reaction product (III) with formaldehyde are given examples by phenol, cresols, xylenols, bisphenol-A, bisphenol-F, resorcinol, catechol, hydroquinone, pyrogallol etc., preferably, phenol and cresol.

(III) is prepared by a condensation reaction of phenolic compounds with formaldehyde under an acidic catalyst. The reaction temperature is usually 50 to 100 degrees C., and the reaction time is usually 1 to 10 hours. The molecular weight of (III) is usually from about 200 to about 1,500, preferably, about 300 to about 1,000. The preferable reaction product (III) is a phenol novolak resin.

In the glycidyl ether of hydrogenated conjugated diene polymers (I), the conjugated diene polymers are given examples by conjugated diene homopolymers, conjugated diene copolymers and conjugated diene olefinic hydrocarbon copolymers.

The glycidyl ether of conjugated diene homopolymers is given examples by a glycidyl ether of hydrogenated butadiene polymers (glycidyl ether of hydrogenated polybutadiene glycol etc.), a glycidyl ether of hydrogenated isoprene polymers (glycidyl ether of hydrogenated polyisoprene glycol etc.), a glycidyl ether of hydrogenated 1,3-pentadiene glycol and a glycidyl ether of hydrogenated polycyclopentadiene glycol. Besides, a glycidyl ether of triol or mono-ol may be used.

Example of suitable glycidyl ethers of conjugated diene copolymers include glycidyl ethers of hydrogenated copolymers, of butadiene and isoprene such as glycidyl ethers of hydrogenated poly(butadieneisoprene) glycol and glycidyl ethers of corresponding of triol or mono-ol.

The glycidyl ethers of copolymers of conjugated dienes and olefinic hydrocarbons include glycidyl ethers of hydrogenated poly (butadiene-styrene) glycol and glycidyl ethers of hydrogenated poly (isoprene-styrene) glycol. The preferable among these are the glycidyl ethers of hydrogenated polybutadiene glycol and that of hydrogenated polyisoprene glycol.

The structural units in the homopolymers and copolymers of butadiene [hereinafter referred to as butadiene (co)polymer] include 1,2-butadiene and 1,4-butadiene, and may include either or both at an arbitrary proportion. The preferable is the one containing at least 70% of 1,2-butadiene structural unit and the more preferable is the one containing at least 85% of 1,2-butadiene structural unit.

Manufacturing of the glycidyl may be done by any known method including a one-stage or two-stage process. In the one-step process, the glycidyl ether can be usually produced by a reaction of the hydrogenated conjugated diene polymer containing hydroxyl group with epichlorohydrin at 30 to 70 degrees C. in the presence of sodium hydroxide.

With the two-step method, it can be synthesized first by an addition reaction of the hydrogenated conjugated diene polymer containing hydroxyl group with epichlorohydrin under a catalyst, and then by removing hydrogen chloride with caustic alkali. The preferable is the one-step method making a product of less total chlorine content.

The number average molecular weight of glycidyl ether (I) is usually from about 500 to about 10,000, preferably, about 1,000 to about 5,000. In the range less than about 500, the thermal stress reducing effect is not enough. In the range over about 10,000, it has not an enough solubility into the resin composition for sealing and therefore can not effect an enough reduction of the thermal stress.

The epoxy equivalent weight of (I) is usually from 200 to 10,000 g/eq, preferably, 500 to 5,000 g/eq.

In this invention, the equivalent ratio of epoxy groups in (II) and (I) to phenolic hydroxyl groups in (III) is usually from 0.6 to 1.4, preferably, 0.75 to 1.25. In the cases less than 0.6 and over 1.25, there is no good balance in a curing reaction between epoxy group and phenolic hydroxyl group and eventually no product of enough strength can be obtained.

Also, the content of (I) in this invention usually ranges from about 1 to about 50 weight % for the total weight of (I), (II) and (III), preferably, from about 2 to about 30 weight %. When it is less than about 1 weight %, the stress reduction is not effected sufficiently, and when it is over about 50 weight % the heat resistivity is not enough. In addition, the content of (I) in this invention usually ranges from about 1 to about 70 weight % for the weight of (II), preferably, about 2 to about 50 weight %.

The resin composition of this invention can be compounded with a curing accelelerator. Example of a curing accelerator include phosphorous compounds, such as triphenyl phosphine, triphenyl phosphite, imidazoles such as 2-methylimidazole, 2-phenylimidazole, 2-undecylimidazole, 2-heptadecylimidazole, 2-ethyl-4-methylimidazol, tertiary amines such as 2-(dimethyl aminomethyl) phenol, 2,4,6-tris (dimethyl aminomethyl) phenol, benzyldimethyl amine, α-methylbenzylmethyl amine, 1,8-diazabicyclo (5,4,0) undecene-7.

The dosage of the curing accelerator is usually from 0.1 to 5.0 parts by weight for 100 parts of (II) by weight, preferably, 0.2 to 3.0 parts by weight.

Furthermore, the resin composition of this invention, if required, can contain one or more additives, for example, fillers such as crystalline silica powder, quartz glass powder and alumina; releasing agents such as higher fatty acids or their metal salts, natural waxes, synthetic waxes and paraffin; coupling agents such as epoxysilane and vinylsilane; and fire retardants such as antimony phosphorus compounds.

The dosage of filler usually ranges from 200 to 800 parts by weight for 100 parts of (II) by weight. The releasing agent, coupling agent and fire retardant are added by from 0.1 to 5 parts by weight for 100 parts of (II) by weight respectively.

The manufacturing method of the abovementioned resin composition for sealing a semiconductor device according to the present invention is adhered by two blending methods. The first one comprising blending (I), (II), (III) and the other additives simultaneously, and the second one comprises blending a preliminary reaction product of (I) with (III) beforehand, with (II) and the other additives. The preferable is the latter method.

In the preliminary reaction between (I) and (III), the preliminary reaction product can be obtained by adding phosphorus compounds, amines or imidazoles as a catalyst to a mixture of (I) and (III) under the condition of usually from 100 to 170 degrees C. and from 1 to 20 hours in the nitrogen atmosphere.

The resin composition of this invention can be obtained by a series of procedures, in which the compounds made by the above-mentioned reactions are kneaded by a kneading machine such as hot rollers and then cooled, pulverized and, if required, made into a tablet.

The resin composition of this invention can be used, if required, by a partial curing (B stage, half-cured state). The partial curing can be carried out usually under the conditions from 50 to 150 degrees C. and from 5 minutes to 5 hours.

The sealing of semiconductor devices with the resin composition of this invention is not particularly limited to, but can be carried out by the ordinary well-known molding method such as a transfer molding. In case of the transfer molding, the molding conditions are usually the pressure of 50 to 90 kg/sq.cm, the temperature from 160 to 200 degrees C. and the time from 60 to 180 seconds.

The semiconductor devices sealed with the resin composition of this invention as abovementioned have the characteristics of low internal stress of sealing resin and reduction of packaging cracks.

EXAMPLES

This invention is explained further by the following examples but not limited to these. The part in the examples and reference examples means the part by weight.

REFERENCE EXAMPLE NO. 1

Synthesis of Glycidyl ether (a)

100 parts of hydrogenated polyisoprene glycol (PIP-H, average molecular weight of 2,500, made by Idemitsu Petrochemicals Corp. Japan), 35 parts of epichlorohydrin, 16 parts of pelletized sodium hydroxide, 1 part of benzyl trimethyl ammonium chloride and 50 parts of toluene were fed and reacted under a vigorous stirring at 50 degrees C. for 5 hours in the nitrogen atmosphere. After the reaction, 100 parts of water were added and the product was washed while stirring for 10 minutes. After laying it quietly, the upper layer was separated and filtered, and then the remaining epichlorohydrin and toluene were removed under vacuum. Thus 90 parts of glycidyl ether of hydrogenated polyisoprene glycol (a) was obtained as a residue. This glycidyl ether (a) had an epoxy equivalent weight of 1,650 g/eq.

REFERENCE EXAMPLE NO. 2

Synthesis of Glycidyl ether (b)

100 parts of hydrogenated polyisoprene glycol (PIP-H, average molecular weight of 2500, made by Idemitsu Petrochemicals Corp. Japan), 9 parts of epichlorohydrin, 0.15 part of trifluoroborondiethylether complex and 50 parts of toluene were fed and carried out addition reaction under vigorous stirring at 55 degrees C. for 5 hours in the nitrogen atmosphere. Then, 9.5 parts of 48% aqueous solution of sodium hydroxide were added and a ring-closing reaction was carried out at 65 degrees C. for 5 hours. After the reaction 100 parts of water were added and the following procedures were carried out same as described in Reference Example No. 1 and 95 parts of glycidyl ether of hydrogenated polyisoprene glycol (b) were obtained. The glycidyl ether (b) had an epoxy equivalent weight of 1,430 g/eq.

REFERENCE EXAMPLE NO. 3

Synthesis of Glycidyl ether (c)

100 parts of hydrogenated polybutadiene glycol (POLYTALE H, average molecular weight of 2,370, 1,2-butadiene structural unit to that of 1,4-butadiene is 20/80, made by Mitsubishi Chemical Ind. Co. Ltd., Japan), 12 parts of epichlorohydrin, 0.2 part of trifluoroboron-diethyl ether complex and 100 parts of toluene were fed, and the reaction and the following procedures were carried out same as Reference Example No. 2, and 85 parts of glycidyl ether of hydrogenated polybutadiene glycol (c) were obtained. The glycidyl ether (c) had an epoxy equivalent weight of 1,520 g/eq.

REFERENCE EXAMPLE NO. 4

Synthesis of Glycidyl ether (f)

100 parts of hydrogenated polybutadiene glycol (NISSO PB G1-1000, average molecular weight of 1,450, 1,2-butadiene structural unit to that of 1,4-butadiene is 90/10, made by Nihon Soda Co. Ltd., Japan), 25 parts of epichlorohydrin, 10 parts of pelletized sodium hydroxide, 1 part of benzyltrimethylammonium chloride and 50 parts of toluene were fed, reacted and followed by the procedures same as Reference Example No. 1, thus 90 parts of glycidyl ether o hydrogenated polybutadiene glycol (f) were obtained. The glycidyl ether (f) had an epoxy equivalent weight of 1,030 g/eq.

REFERENCE EXAMPLE NO. 5

Synthesis of Glycidyl ether (g)

100 parts of hydrogenated polybutadiene glycol (NISSO PB G1-2000, average molecular weight of 2,500, 1,2-butadiene structural unit to that of 1,4-butadiene is 90/10, made by Nihon Soda Co. Ltd.), 30 parts of epichlorohydrin, 13 parts of pelletized sodium hydroxide, 1 part of benzyltrimethylammonium chloride and 50 parts of toluene were fed, reacted and followed by the procedures same as Reference Example No. 1, thus 85 parts of glycidyl ether of hydrogenated polybutadiene glycol (g) were obtained. The glycidyl ether (g) had an epoxy equivalent weight of 1,800 g/eq.

REFERENCE EXAMPLE NO. 6

Synthesis of Glycidyl ether (h)

100 parts of hydrogenated poly (butadiene-isoprene) glycol [a product of polymerization reaction between 50 mole % of butadiene and 50 mole % of isoprene at 80 degrees C. for 5 hours by using hydrogen peroxide as a catalyst, its average molecular weight of 2900, 1,2-butadiene structural unit to that of 1,4-butadiene is 20/80], 40 parts of epichlorohydrin, 18 parts of pelletized sodiuma hydroxide, 1 part of benzyltrimethylammonium chloride and 70 parts of toluene were fed, reacted and followed by the procedures same as Reference Example No. 1, thus 80 parts of glycidyl ether of hydrogenated poly (butadiene-isoprene) glycol (h) were obtained. The glycidyl ether (h) had an epoxy equivalent weight of 1,950 g/eq.

REFERENCE EXAMPLE NO. 7

Synthesis of Preliminary Reaction Product of (I) and (III) (d)

100 parts of phenol novolak resin (TAMANOL 758, made by Arakawa Chemicals Co. Ltd., Japan), 20 parts of glycidyl ether of hydrogenated polyisoprene glycol (a) synthesized in Reference Example No. 1 and 1 part of triphenyl phosphine were reacted at 150 degrees C. for 3 hours under the purging of nitrogen to a product of preliminary reaction (d).

REFERENCE EXAMPLE NO. 8

Synthesis of Preliminary Reaction Product of (I) and (III) (e)

100 parts of phenol novolak resin (TAMANOL 758, made by Arakawa Chemicals Co. Ltd.), 40 parts of glycidyl ether of hydrogenated polybutadiene glycol (c) synthesized in Reference Example No. 3 and 0.5 parts of 2-ethyl-4-methylimidazole were reacted at 160 degrees C. for 2 hours under the purging of nitrogen to a product of preliminary reaction (e).

REFERENCE EXAMPLE NO. 9

Synthesis of Preliminary Reaction Product of (I) and (III) (i)

100 parts of phenol novolak resin (TAMANOL 758, made by Arakawa Chemicals Co. Ltd.), 40 parts of glycidyl ether of hydrogenated polybutadiene glycol (f) synthesized in Reference Example No. 4 and 0.5 part of triphenyl phosphine were reacted at 150 degrees C. for 3 hours under the purging of nitrogen to a product of preliminary reaction (i).

REFERENCE EXAMPLE NO. 10

Synthesis of Preliminary Reaction Product of (I) and (III) (j)

100 parts of phenol novolak resin (TAMANOL 758, made by Arakawa Chemicals Co. Ltd.), 40 parts of glycidyl ether of hydrogenated polybutadiene glycol (g) synthesized in Reference Example No. 5 and 1 part of 1.8-diazabicyclo (5,4,0) undecene-7 were reacted at 150 degrees C. for 2 hours under the purging of nitrogen to a product of preliminary reaction (j).

REFERENCE EXAMPLE NO. 11

Synthesis of Preliminary Reaction Product of (I) and (III) (k)

100 parts of phenol novolak resin (TAMANOL 758, made by Arakawa Chemicals Co. Ltd.), 40 parts of glycidyl ether of hydrogenated poly (butadiene-isoprene) glycol (h) synthesized in Reference Example No. 6 and 1 part of triphenyl phosphine were reacted at 150 degrees C. for 2 hours under the purging of nitrogen to a product of preliminary reaction (k).

EXAMPLE NO. 1

A cresol novolak epoxy resin (SUMIEPOXY ESCN 220L, epoxy equivalent of 210 g/eq, made by Sumitomo Chemicals Co. Ltd., Japan), a phenol novolak resin (TAMANOL 758, made by Arakawa Chemicals Co. Ltd.), the glycidyl ether of hydrogenated polyisoprene glycol (a) synthesized in Reference Example No. 1, triphenyl phosphine as a curing accelerator, fused silica as fillers, silane coupling agent, carnauba wax, antimony trioxide and carbon black were mixed by the recipe shown in Table 1, kneaded with hot rollers, cooled down and pulverized into the resin composition of this invention.

The resin composition obtained herein was molded under the conditions of 175 degrees C., and 3 minutes. It was postcured at 180 degrees C. for 16 hours to make a cured test piece.

The cured test piece obtained was determined for bending elasticity, glass transition temperature, and volumetric resistivity before and after pressure-cooker test at 120 degrees C., 2 atmospheric pressures and for 200 hours. The result is shown in Table 2.

Also, by using the resin composition obtained herein, a silicon semiconductor element was molded on a 48 pin flat package by means of the transfer molding at 175 degrees C./120 seconds, and then it was after-cured at 175 degrees C./5 hours. The semiconductor devices (each 10 pieces), which were obtained as stated above and shown in FIG. 1, were determined the number of package cracks by means of the temperature cycle test (TCT), 1,000 times of which were carried out at −196 degrees C./2 minutes to 150 degrees C./2 minutes. The result is shown in Table 2.

In FIG. 1, 1 indicates lead frame, 2: semiconductor element, 3: bonding wire, 4: die pad, 5: protecting cover, 6: sealing resin.

EXAMPLE NO. 2

The glycidyl ether of hydrogenated polyisoprene glycol (b), which was synthesized in Reference Example No. 2, was used as (I). Except it, a resin composition was made by the recipe shown in Table 1. Except it, a resin composition was prepared and evaluated by carrying out all the other procedures same as Example No. 1. The result is shown in Table 2.

EXAMPLE NO. 3

The glycidyl ether of hydrogenated polybutadiene glycol (c) was used as (I). Except it, a resin composition was prepared by the recipe shown in Table 1. Except it, a resin composition was prepared and evaluated by carrying out all the other procedures same as Example No. 1. The result is shown in Table 2.

EXAMPLE NO. 4

A cresol novolak epoxy resin (SUMIEPOXY-ESCN 220L, epoxy equivalent weight of 210 g/eq, made by Sumitomo Chemicals Co. Ltd.), the preliminary reaction product (d) prepared in Reference Example No. 7, triphenyl phosphine as a curing accelerator, fused silica as fillers, a silane coupling agent, carnauba wax, antimony trioxide and carbon black were mixed by the recipe shown in Table 1. Except it, a resin composition was prepared and evaluated by carrying out all the other procedures same as Example No. 1. The result is shown in Table 2.

EXAMPLE NO. 5

Except that the preliminary reaction product (e) prepared in Reference Example No. 8 was used, all the other procedures were carried out same as Example No. 4 and a resin composition was prepared by the recipe shown in Table 1 and evaluated. The result is shown in Table 2.

EXAMPLE NO. 6

Except that the preliminary reaction product (i) prepared in Reference Example No. 9 was used, all the other procedures were carried out same as Example No. 4 and a resin composition was prepared by the recipe shown in Table 1 and evaluated. The result is shown in Table 2.

TABLE 1

|  | Examples |  |  |  |  |  |  |  | Comparison |
|---|---|---|---|---|---|---|---|---|---|
|  | 1 | 2 | 3 | 4 | 5 | 6 | 7 | 8 | 1 |
| i | 100 | 100 | 100 | 100 | 100 | 100 | 100 | 100 | 100 |
| ii | 50 | 50 | 50 | — | — | — | — | — | 50 |
| iii | 10 | — | — | — | — | — | — | — | — |
| iv | — | 30 | — | — | — | — | — | — | — |
| v | — | — | 20 | — | — | — | — | — | — |
| vi | — | — | — | 60 | — | — | — | — | — |
| vii | — | — | — | — | 70 | — | — | — | — |
| viii | — | — | — | — | — | 70 | — | — | — |
| ix | — | — | — | — | — | — | 70 | — | — |
| x | — | — | — | — | — | — | — | 70 | — |
| xi | 1 | 1 | 1 | 1 | 1 | 1 | 1 | 1 | 1 |
| xii | — | — | — | — | — | — | 1 | 1 | — |
| xiii | 300 | 300 | 300 | 300 | 300 | 300 | 300 | 300 | 300 |
| xiv | 1 | 1 | 1 | 1 | 1 | 1 | 1 | 1 | 1 |
| xv | 1 | 1 | 1 | 1 | 1 | 1 | 1 | 1 | 1 |
| xvi | 2 | 2 | 2 | 2 | 2 | 2 | 2 | 2 | 2 |
| xvii | 1 | 1 | 1 | 1 | 1 | 1 | 1 | 1 | 1 |

Remarks:
i: Cresol novolak epoxy resin
ii: Phenol novolak resin
iii: Glycidyl ether of hydrogenated polyisopreneglycol (a)
iv: Glycidyl ether of hydrogenated polyisopreneglycol (b)
v: Glycidyl ether of hydrogenated polybutadieneglycol (c)
vi: Preliminary reaction product shown in Reference Example No. 7 (d)
vii: Preliminary reaction product shown in Reference Example No. 8 (e)
viii: Preliminary reaction product shown in Reference Example No. 9 (i)
ix: Preliminary reaction product shown in Reference Example No. 10 (j)
x: Preliminary reaction product shown in Reference Example No. 11 (k)
xi: Triphenyl phosphine
xii: 1,8-diazabicyclo(5,4,0)undecene-7
xiii: Fused silica
xiv: Silane coupling agent
xv: Carnauba wax
xvi: Antimony trioxide
xvii: Carbon black

TABLE 2

| Example No. | Bending Elasticity (kg/mm$^2$) | Glass Transition Temperature (°C.) | Volumetric Resistivity | | TCT Test/ 10 pieces |
|---|---|---|---|---|---|
| | | | First stage ($\Omega$ cm $\times 10^{15}$) | Pressure-cooker Test | |
| 1 | 1250 | 167 | 64 | 5.0 | 0/10 |
| 2 | 1150 | 162 | 72 | 6.9 | 1/10 |
| 3 | 1220 | 165 | 65 | 5.3 | 1/10 |
| 4 | 1260 | 167 | 66 | 5.2 | 0/10 |
| 5 | 1280 | 166 | 62 | 4.7 | 1/10 |
| 6 | 1290 | 166 | 67 | 6.0 | 0/10 |
| 7 | 1250 | 164 | 69 | 6.2 | 0/10 |
| 8 | 1270 | 165 | 65 | 5.9 | 0/10 |
| Comparison Example | | | | | |
| 1 | 1600 | 168 | 55 | 4.3 | 10/10 |

EXAMPLE NO. 7

Except that the preliminary reaction product (j) prepared in Reference Example No. 10 was used, all the other procedures were carried out same as Example No. 4 and a resin composition was prepared by the recipe shown in Table 1 and evaluated. The result is shown in Table 2.

EXAMPLE NO. 8

Except that the preliminary reaction product (k) prepared in Reference Example No. 11 was used, all the other procedures were carried out same as Example No. 4 and a resin composition was prepared by the recipe shown in Table 1 and evaluated. The result is shown in Table 2.

COMPARISON EXAMPLE 1

Except that (I) was not added, all the other procedures were carried out same as Example No. 1, and a resin composition was prepared by the recipe shown in Table 1 and evaluated. The result is shown in Table 2.

What is claimed as new and desired to be secured by Letter Patent is:

1. A composition for sealing a semiconductor, which comprises,
   (I) a glycidyl ether of a hydrogenated conjugated diene polymer,
   (II) an epoxy resin other than that utilized in component (I), and
   (III) a reaction product of a phenolic compound with formaldehyde.

2. The composition of claim 1, wherein the hydrogenated conjugated diene polymer is a hydrogenated polymer of at least one diene selected from the group consisting of butadiene and isoprene.

3. The composition of claim 1, wherein the hydrogenated conjugated diene polymer is a hydrogenated one of a conjugated diene polymer having 1,2-butadiene structural units.

4. The composition of claim 3, wherein the conjugated diene polymer has at least 70% of 1,2-butadiene structural units and from 0 to 30% of 1,4-butadiene structural units.

5. The composition of claim 1, wherein said glycidyl ether (I) has a number average molecular weight of about 500 to about 10,000.

6. The composition of claim 1, wherein the phenolic compound is at least one compound selected from the group consisting of phenol, cresols, xylenols, bisphenols, resorcinol, catechol, hydroquinone, and pyrogallol.

7. The composition of claim 1, wherein said reaction product (III) comprises a phenol novolak resin.

8. The composition of claim 1, wherein said other epoxy resin (II) is at least one epoxy resin selected from the group consisting of bisphenol epoxy resins, phenol-novolak epoxy resins, cresol-novolak epoxy resins, phenol epoxy resins, aromatic epoxy resins, cycloaliphatic epoxy resins, butadiene diepoxide, trimethyrol propane di- and triglycidyl ethers, glycerol di- and triglycidyl ethers and bis-(2,3-epoxy-cyclopentyl) ether.

9. The composition of claim 1, wherein said glycidyl ether (I) is present in an amount of about 1 to about 50% based on the total weight of (I), (II), and (III).

10. The composition of claim 1, wherein the equivalent ratio of epoxy groups in (I) and (II) to phenolic hydroxyl groups in (III) is from 0.6 to 1.4.

11. The composition of claim 1, which further contains at least one additive selected from the group consisting of a curing accelerator, a filler, a release agent, a coupling agent and a flame retardant.

12. A composition for sealing a semiconductor, which comprises a partly cured product of the composition of claim 1.

13. A composition for sealing a semiconductor, which comprises (I) a glycidyl ether of a hydrogenated conjugated diene polymer, reacted beforehand with (III) a reaction product of a phenolic compound with formaldehyde and (II) an epoxy resin other than that used in component (I).

14. The composition of claim 13, whrerin said glycidyl ether (I) is present in an amount of about 1 to about 50%, based on the total weight of (I), (II) and (III).

15. The composition of claim 13, wherein the equivalent ratio of epoxy groups in (I) and (II) to phenolic hydroxyl groups in (III) is from 0.6 to 1.4.

16. A composition for sealing a semiconductor, which comprises a partly cured product of the composition of claim 13.

* * * * *

UNITED STATES PATENT AND TRADEMARK OFFICE
CERTIFICATE OF CORRECTION

PATENT NO. : 5,162,437
DATED : November 10, 1992
INVENTOR(S) : Hiroshi Hayashi, Yuichi Fujii, Motoyuki Suzuki It is certified that error appears in the above-indentified patent and that said Letters Patent is hereby corrected as shown below:

On the title page: item 30 insert the foreign application priority date of

--February 13, 1990 (JP) Japan 2-33223--

Signed and Sealed this

Twelfth Day of April, 1994

*Attest:*

BRUCE LEHMAN

*Attesting Officer*     *Commissioner of Patents and Trademarks*